(12) United States Patent
Storm et al.

(10) Patent No.: US 12,712,007 B2
(45) Date of Patent: Aug. 18, 2026

(54) SEQUENCED ACTIVATION OF MEMORY COMPONENTS

(71) Applicant: Micron Technology, Inc., Boise, ID (US)

(72) Inventors: Shawn Storm, Boise, ID (US); Brittany A. Boyd, Boise, ID (US); Christopher Kuhn, Boise, ID (US); Eric S. Nelson, Boise, ID (US); Craig A. Farrer, Boise, ID (US); Kazuo Shibata, Sagamihara City (JP)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 18/677,571

(22) Filed: May 29, 2024

(65) Prior Publication Data

US 2024/0412770 A1 Dec. 12, 2024

Related U.S. Application Data

(60) Provisional application No. 63/472,201, filed on Jun. 9, 2023.

(51) Int. Cl.
*G11C 11/4072* (2006.01)
*G11C 5/14* (2006.01)
*G11C 11/4076* (2006.01)

(52) U.S. Cl.
CPC .......... *G11C 11/4072* (2013.01); *G11C 5/147* (2013.01); *G11C 11/4076* (2013.01)

(58) Field of Classification Search
CPC . G11C 11/4072; G11C 5/147; G11C 11/4076; G11C 5/04; G11C 5/148; G11C 11/4074; G11C 5/063
See application file for complete search history.

(56) References Cited

U.S. PATENT DOCUMENTS 8,559,258 B1 * 10/2013 Stephens, Jr. ....... G11C 11/4094 365/222
10,360,964 B2 7/2019 Berger et al.
11,922,990 B2 * 3/2024 Prather ................ G06F 13/102
11,928,343 B2 * 3/2024 Yu .......................... G06F 3/061
2004/0148482 A1 * 7/2004 Grundy ............... G06F 13/4256 711/104
2008/0049250 A1 * 2/2008 Sugishita ........... H04N 1/00885 358/1.15
2015/0331476 A1 * 11/2015 Slik ...................... G06F 1/3209 713/324
2016/0141015 A1 * 5/2016 Lee ..................... G11C 11/4087 365/226

(Continued)

*Primary Examiner* — Mushfique Siddique
(74) *Attorney, Agent, or Firm* — Brooks, Cameron & Huebsch, PLLC

(57) ABSTRACT

A method includes providing, in accordance with a memory component activation sequence, a first activation power to a first memory component of a plurality of memory components for a first time period, where the first activation power is provided in the absence of providing an activation power to at least one other memory component of the plurality of memory components during the first time period. The method includes providing, in accordance with the memory component activation sequence, a second activation power to a second memory component for a second time period.

20 Claims, 4 Drawing Sheets

(56) References Cited

U.S. PATENT DOCUMENTS

| | | | | |
|---|---|---|---|---|
| 2020/0050252 | A1* | 2/2020 | Rowley | G06F 3/0625 |
| 2020/0411069 | A1* | 12/2020 | Rowley | G11C 5/148 |
| 2021/0141944 | A1* | 5/2021 | Meier | G06F 21/79 |
| 2021/0167606 | A1 | 6/2021 | Carré et al. | |
| 2021/0200292 | A1* | 7/2021 | Benjamin | G06F 1/3203 |
| 2021/0375332 | A1* | 12/2021 | Akamatsu | G06F 3/0659 |
| 2022/0319569 | A1* | 10/2022 | Veches | G06F 13/1668 |
| 2023/0410890 | A1* | 12/2023 | Shaeffer | G11C 29/028 |

* cited by examiner

SEQUENCED ACTIVATION OF MEMORY COMPONENTS

PRIORITY INFORMATION

This application claims the benefit of U.S. Provisional Application No. 63/472,201, filed on Jun. 9, 2023, the contents of which are incorporated herein by reference.

TECHNICAL FIELD

Embodiments of the disclosure relate generally to memory systems, and more specifically, relate to sequenced activation of memory components.

BACKGROUND

A memory system can include one or more memory devices that store data. The memory devices can be, for example, non-volatile memory devices and volatile memory devices. In general, a host system can utilize a memory system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure.

DETAILED DESCRIPTION

Figure 1:
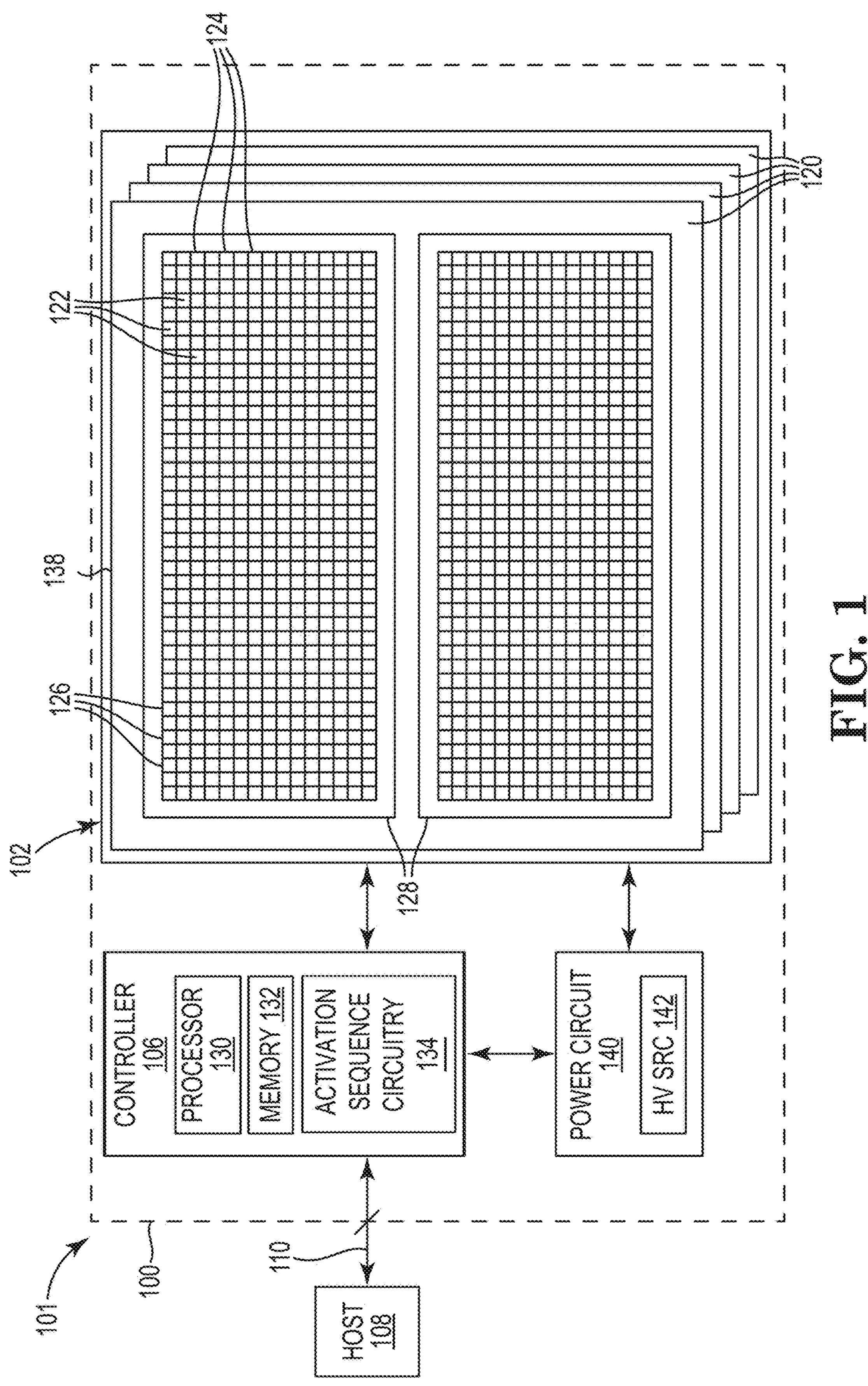
FIG. 1 illustrates an example memory system configured in accordance with some embodiments of the disclosure.

Aspects of the disclosure are directed to sequenced activation of memory components and, in particular to memory systems (e.g., memory sub-systems) configured to employ sequenced activation of memory components. The memory components may be included in a memory system. A memory system (e.g., memory sub-system) can be a storage system, storage device, a memory module, or a combination of such. An example of a memory sub-system is a storage system such as a solid-state drive (SSD). Examples of storage devices and memory modules are described below in conjunction with FIG. 1, et alibi.

A memory device, such as a dynamic random access memory (DRAM) or a solid-state drive (SSD) may be activated (powered-on) by power provided from a power supply. For instance, when power is supplied to the memory device, the memory device's power management circuitry may detect the voltage and begin to regulate the voltage to a stable voltage level that is suitable for operation of the memory device. Such voltage regulation may involve ramping up the voltage and current during a power-on ramp phase to a required operational level of the memory device (or a portion of the memory device) in a controlled manner.

The power-on ramp phase refers to the initial period of time after a memory device is powered up during which a voltage applied to the memory components in the memory device ramps up gradually to a full operating voltage. The ramped voltage may be referred to as a ramped activation power. The ramped activation power may be a device core power ($V_{dd}$), a device I/O power ($V_{ddq}$), and/or a reference voltage ($V_{ref}$), among other types of voltages, that is ramped over a period of time. The ramping process is intended to prevent damage to the memory cells and other components of the device that may occur if the full operating voltage were applied suddenly. During the power-on ramp phase, the memory device may initially be in a state where it is not fully operational, and some operations, such as write or read operation, may not be possible. That is, the memory components of the memory device are not yet "initialized". However, following completion of a power on ramp phase a given memory component is "initialized" and thereby allows the memory component to be accessed by a host system and for data to be read and/or written to the memory component.

Some previous approaches may size a voltage regulator in an effort to account for the "worst-case" presence of ramping all memory components at the same time during memory device activation. Such approaches may employ high-powered voltage regulators with a high voltage and/or current delivery capacity to ensure that a sufficient amount of voltage/current is available to provide an activation power (e.g., a ramped activation power) to each memory component in a memory device at substantially the same time. That is, the previous approaches may provide a respective activation power to each of the memory components in the memory device at that same time.

Yet, such approaches may be inefficient (e.g., consume relatively large amounts of power during normal memory device operation) and/or may be costly. The inefficient operation of the high-powered voltage regulator may be particularly burdensome in mobile devices or other types of device that may operate on a limited amount of battery power. Further, such approaches may occupy a disproportionate amount of physical space thereby reducing an amount of space available for other circuitry such as memory components. Such inefficient use of space can therefore reduce the overall performance of a memory system in which such methodologies are employed. Additionally, at least due to the presence of the high-powered voltage regulator such approaches may generate large amounts of heat (e.g., which may be detrimental to an operational lifetime and/or performance of memory components). Furthermore, some previous approaches may permit an end user, administrator, or other individual to configure memory device power use during operation (e.g., adjust an operational envelope of the memory device). However, such approaches may not permit peak power consumption during activation to be limited (e.g., may not permit different memory components in a memory device to be activated at different times).

To address the above and other deficiencies, approaches herein employ sequenced activation of memory components. For instance, the memory components may be activated in accordance with a memory component activation sequence. As used herein, memory component activation sequence refers to a designated activation order of a plurality of memory components such as a plurality of memory die, a plurality of packages (memory packages including a plurality of memory die), or both. Notably, the memory component activation sequences herein may permit some but not all of the memory components to be activated at substantially the same time. For instance, some but not all of the memory die may be activated at a given time and/or some but not all packages may be activated at a particular time.

As such, approaches herein may have a lower peak power consumption (a lower maximum instantaneous voltage and/or a lower maximum instantaneous current) during activation of the memory components, than other approaches such as those which activate all memory devices and all packages at the same time. Unlike the previous approaches such as those described above, the sequenced activation of memory components (e.g., memory die, packages, or both) may exhibit relatively low peak power consumption during activation of each of the memory components. For instance, a peak power consumption (peak current and/or voltage) of memory components in the approaches herein can be a fraction of the peak power consumption associated with other approaches such as those that activate all memory dies and packages at substantially the same time. Moreover, at least due to the relatively lower peak power consumption during activation, the approaches herein may permit use of a relatively smaller voltage regulator and thereby may be more efficient (e.g., consume less power during normal memory device operation), less costly, and/or may occupy less physical space than the previous approaches can therefore yield enhanced overall performance of a computing system and/or a memory device in which such methodologies are employed.

In the interest of clarity, embodiments herein will be generally described in relation to circuitry having a given quantity of memory die and packages, however, it will be appreciated that embodiments in which a different quantity of memory die and/or packages are contemplated within the scope of the disclosure. In the interest of clarity, embodiments herein will be generally described in relation to a memory device, however, it will be appreciated that embodiments in which a cache is utilized are contemplated within the scope of the disclosure.

FIG. 1 is a block diagram of a system 101 having a memory device 100 configured in accordance with some embodiments of the disclosure. As shown, the memory device 100 includes a main memory 102 (e.g., NAND flash, NOR flash, chalcogenide PCM, etc.) and a controller 106 operably coupling the main memory 102 to a host device 108 (e.g., an upstream central processor (CPU)).

The main memory 102 includes a plurality of memory regions, or memory units 120, which each include a plurality of memory cells 122. Memory units 120 can be individual memory dies, memory planes in a single memory die, a stack of memory dies (vertically stacked) vertically connected with through-silicon vias (TSVs), or the like. For example, in one embodiment, each of the memory units 120 can be formed from a semiconductor die and arranged with other memory unit dies in a single device package (package 138). In other embodiments, multiple memory units 120 can be co-located on a single die and/or distributed across multiple device packages such as package 138 which is coupled to a substrate such as a PCB. That is, while the main memory 102 illustrated in FIG. 1 includes an individual package (the package 138), in various instances the main memory 102 may include a plurality of packages (e.g., a plurality of packages each including vertically stacked memory dies).

The memory cells 122 can include, for example, floating gate, charge trap, phase change, ferroelectric, magnetoresistive, and/or other suitable storage elements configured to store data persistently or semi-persistently. The main memory 102 and/or the individual memory units 120 can also include other circuit components (not shown), such as multiplexers, decoders, buffers, read/write drivers, address registers, data out/data in registers, etc., for accessing and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Each word line can include one or more memory pages, depending upon the number of data states the memory cells 122 of that word line are configured to store. For example, a single word line of memory cells 122 in which each memory cell 122 is configured to store one of two data states (e.g., SLC memory cells configured to store one bit each) can include a single memory page. Alternatively, a single word line of memory cells 122 in which each memory cell 122 is configured to store one of four data states (e.g., MLC memory cells configured to store two bits each) can include two memory pages. Moreover, memory pages can be interleaved so that a word line comprised of memory cells 122 in which each memory cell 122 is configured to store one of two data states (e.g., SLC memory cells) can span two memory pages, in an "even-odd bit line architecture," where all the memory cells 122 in odd-numbered columns 126 of a single word line are grouped as a first memory page, and all the memory cells 122 in even-numbered columns 126 of the same word line are grouped as a second memory page. When even-odd bit line architecture is utilized in a word line of memory cells 122 in which each memory cell 122 is configured to store larger numbers of data states (e.g., memory cells configured as MLC, TLC, QLC, etc.), the number of memory pages per word line can be even higher (e.g., 4, 6, 8, etc.)

Each column 126 can include a string of series-coupled memory cells 122 connected to a common source. The memory cells 122 of each string can be connected in series between a source select transistor (e.g., a field-effect transistor) and a drain select transistor (e.g., a field-effect transistor). Source select transistors can be commonly coupled to a source select line, and drain select transistors can be commonly coupled to a drain select line.

In other embodiments, the memory cells 122 can be arranged in different types of hierarchies and/or groups than those shown in the illustrated embodiments. For instance, in some embodiments the memory cells 122 can be configured as or include FinFET with a semiconductor fin that is covered by a gate. Channel regions of the FinFET are formed within the fins at the intersections between the gate conductors and the fins. For instance, the FinFET can be a n-type FinFET or a p-type FinFET.

Further, although shown in the illustrated embodiments with a certain number of memory cells, rows, columns, blocks, and memory units for purposes of illustration, the number of memory cells, rows, columns, blocks, and memory units can vary, and can, in other embodiments, be larger or smaller in scale than shown in the illustrated examples. For example, in some embodiments, the memory device 100 can include only one memory unit 120. Alternatively, the memory device 100 can include 2, 3, 4, 8, 10, or more (e.g., 16, 32, 64, or more) memory units 120. Although the memory units 120 are shown in FIG. 1 as including two memory blocks 128 each, in other embodiments, each memory unit 120 can include 1, 3, 4, 8, or more (e.g., 16, 32, 64, 100, 128, 256, or more memory blocks). In some embodiments, each memory block 128 can include, for example, 215 memory pages, and each memory page within a block can include, for example, 212 memory cells 122 (e.g., a "4k" page).

The controller 106 can be a microcontroller, special purpose logic circuitry (e.g., a field programmable gate array (FPGA), an application specific integrated circuit (ASIC), etc.), or other type of suitable processor. The controller 106 can include a processor 130 configured to execute instructions stored in memory. The controller 106 may be resident on the main memory 102 and/or may be located elsewhere on the memory device 100. For instance, some or all of the elements of the controller 106 may be located on one or more packages and/or one or more memory die in the main memory 102.

In the illustrated example, the memory of the controller 106 includes an embedded memory 132 configured to perform various processes, logic flows, and routines for controlling operation of the memory device 100, including managing the main memory 102 and handling communications between the memory device 100 and the host device 108. In some embodiments, the embedded memory 132 can include memory registers storing, for example, memory pointers, fetched data, etc. The embedded memory 132 can include volatile and/or non-volatile memory (e.g., DRAM, SRAM, NAND, NOR, PCM) for storing the memory registers, and can also include read-only memory (ROM) (e.g., for storing micro-code). Although in the example set forth in FIG. 1, a memory device 100 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the main memory 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 1).

The controller 106 and/or the main memory 102 can be coupled to a power circuit 140 configured to provide power used during operation and activation of the main memory 102. The power circuit 140 can provide lower voltages (e.g., below 5V) and/or higher voltages (e.g., greater than 5V) to different circuits/domains. For example, the power circuit 140 can include circuit to provide the lower voltages for reading the memory regions and/or for executing internal operations. Also, the power circuit 140 can include a high voltage source 142 configured to provide the higher voltages for programming the memory regions. Additionally, the power circuit 140 can be configured to provide power for activation of the main memory 102, as described herein.

The controller 106 communicates with the host device 108 over a host-device interface 110. In some embodiments, the host device 108 and the controller 106 can communicate over a serial interface, such as a serial attached SCSI (SAS), a serial AT attachment (SATA) interface, a peripheral component interconnect express (PCIe), an I2C/I3C interface, and/or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation). A request can also include an interrupt or another command that indicates a change in condition (e.g., a power loss event), which can trigger the implementation of a power loss algorithm.

Host device 108 can be any one of a number of electronic devices capable of utilizing memory for the temporary or persistent storage of information, or a component thereof. For example, host device 108 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). Host device 108 may be a networking device (e.g., a switch, a router, etc.) or a recorder of digital images, audio and/or video, a vehicle, an appliance, a toy, or any one of a number of other products. In one embodiment, host device 108 may be connected directly to memory device 100, although in other embodiments, host device 108 may be indirectly connected to memory device 100 (e.g., over a networked connection or through intermediary devices).

The controller 106 can include activation sequence circuitry 134. Although not shown in FIG. 1 so as to not obfuscate the drawings, the activation sequence circuitry 134 can include various circuitry to facilitate aspects of the disclosure described herein. In some embodiments, the activation sequence circuitry 134 can include special purpose circuitry in the form of an ASIC, FPGA, a load-switch, state machine, hardware processing device, and/or other logic circuitry that can allow the activation sequence circuitry 134 to orchestrate and/or perform operations such as sequenced activation of memory components, particularly with respect to a system-on-chip, in accordance with the disclosure. For instance, the activation sequence circuitry 134 may include a load switch and/or other circuitry (e.g., data-calibration (DQ) circuitry) that is configured to apportion some but not all of the memory components herein with an activation power at a given time in accordance with a memory component activation sequence, as described herein.

In some embodiments, the controller 106 includes at least a portion of the activation sequence circuitry 134. For example, the controller 106 can include a processor 130 (processing device) configured to execute instructions stored in a local memory 132 for performing the operations described herein. In some embodiments, the activation sequence circuitry 134 is part of the host system 108, an application, or an operating system. The activation sequence circuitry 134 can be resident on the main memory 102 and/or the controller (memory controller) 106. As used herein, the term "resident on" refers to something that is physically located on a particular component. For example, the activation sequence circuitry 134 being "resident on" the main memory 102, for example, refers to a condition in which the hardware circuitry that comprises the activation sequence circuitry 134 is physically located on the main memory 102. The term "resident on" may be used interchangeably with other terms such as "deployed on" or "located on," herein.

The activation sequence circuitry 134 can be configured to detect a power-up event associated with the main memory 102. A power-up event can be detected based on a change in an indicator/flag or other mechanism and/or based on a change in a voltage/current in the main memory 102, among other possibilities. In some embodiments, the power-up event can be detected by components of the main memory 102 prior to and/or in the absence of receipt of main memory initiation commands originating from the host 108. Accordingly, in some embodiments, the power-up event can be detected by components of the main memory 102 before the host 108 propagates signals or asserts commands on the main memory 102 that invoke memory cells of the memory components (e.g., the package and/or the memory die) in the main memory 102.

Detection of the power-up event may allow or promote the activation sequence circuitry 134 to perform the operations described herein. For instance, the activation sequence circuitry 134 may be configured to determine the memory component activation sequence responsive to an occurrence of a power-up event associated with the system and may subsequently cause the memory components to be activated sequentially, as described herein.

Figure 2A:
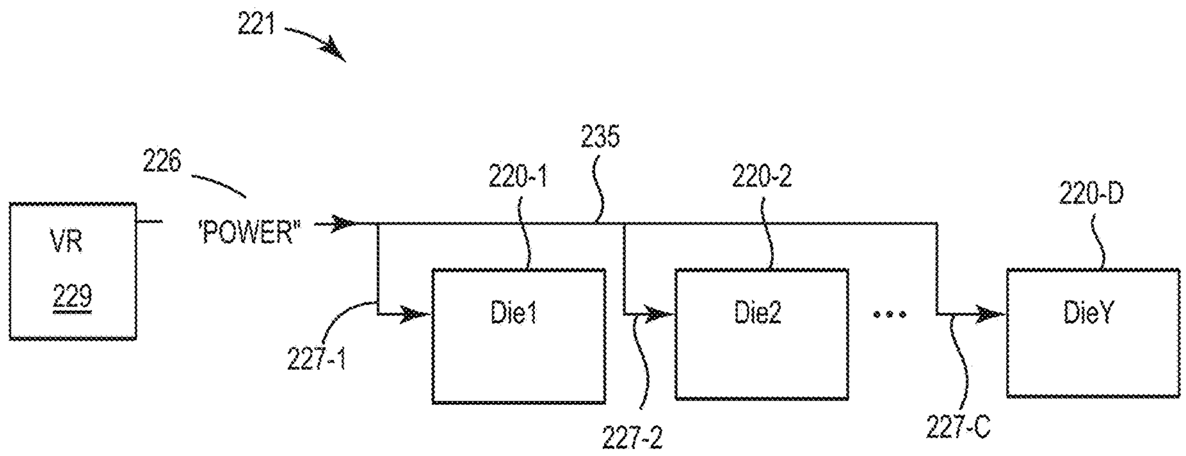
FIG. 2A illustrates an example configuration of memory die suitable for sequenced activation of memory components in accordance with some embodiments of the disclosure.
Figure 2B:
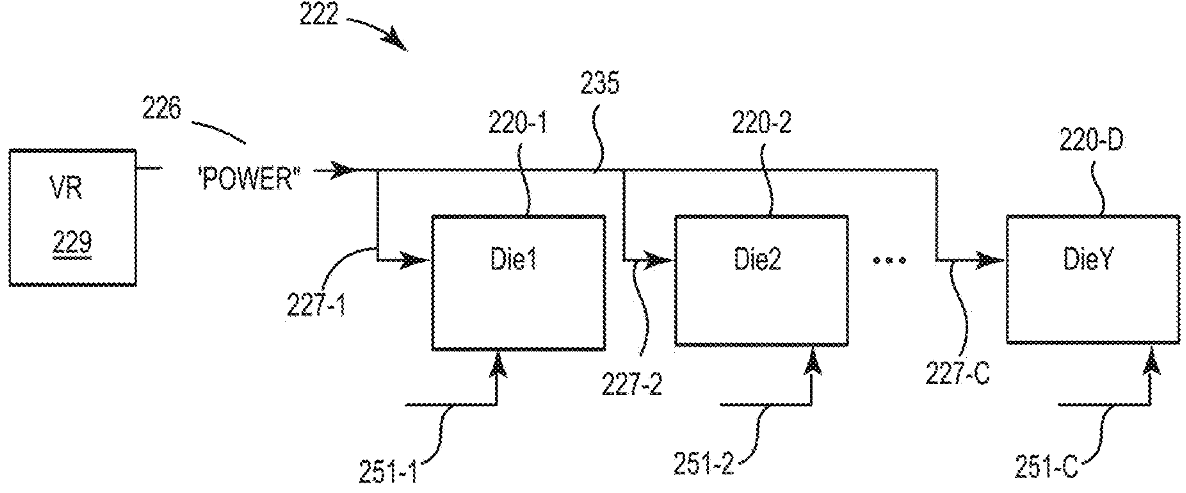
FIG. 2B illustrates another example configuration of memory die suitable for sequenced activation of memory components in accordance with some embodiments of the disclosure.
Figures 2C, 3A, 3B:
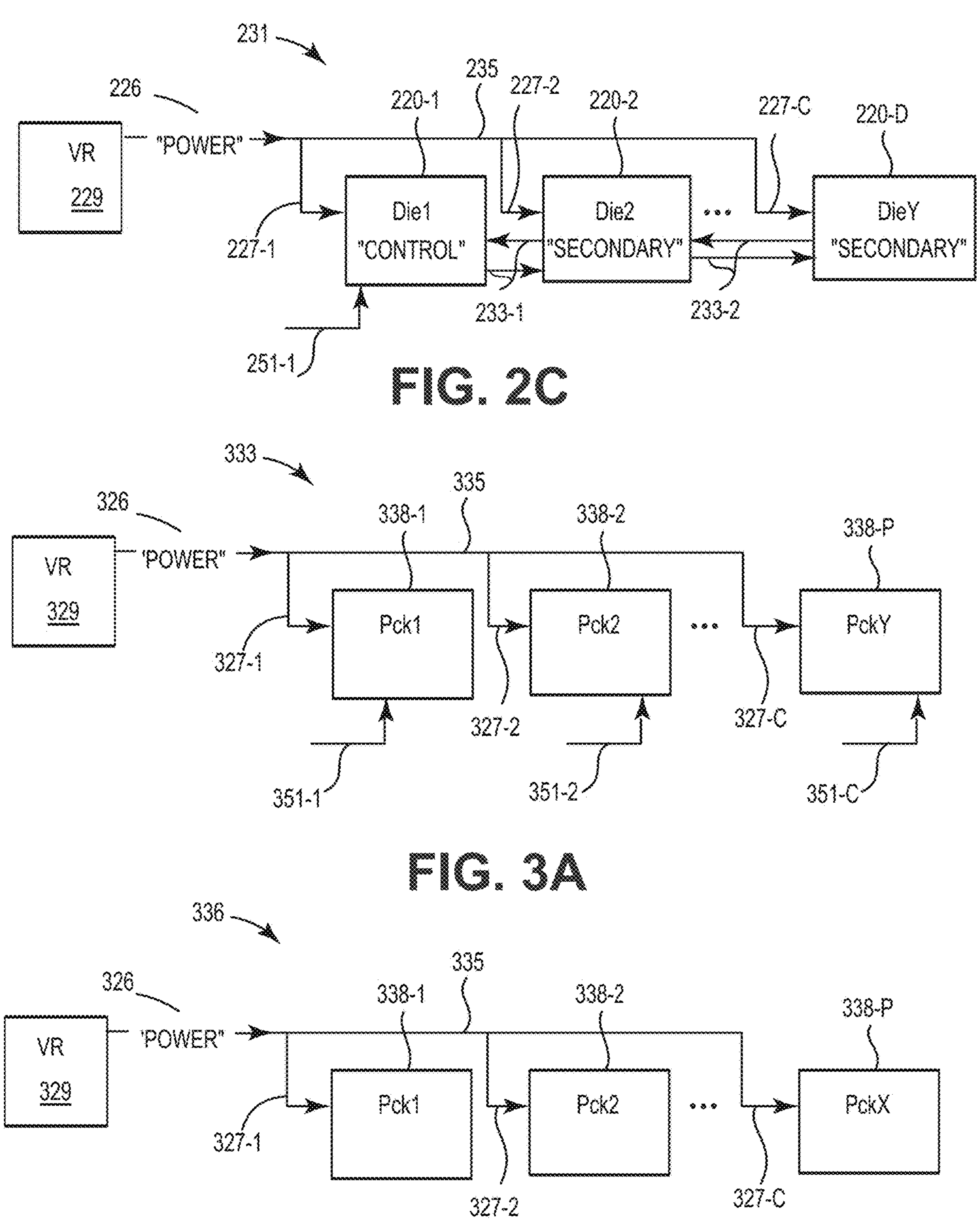
FIG. 2C illustrates yet another example configuration of memory die suitable for sequenced activation of memory components in accordance with some embodiments of the disclosure.
FIG. 3A illustrates an example configuration of packages suitable for sequenced activation of memory components in accordance with some embodiments of the disclosure.
FIG. 3B illustrates another example configuration of packages suitable for sequenced activation of memory components in accordance with some embodiments of the disclosure.

For instance, the memory components may be daisy-chained together, as described herein in FIG. 2A and FIG. 3B. In such embodiments, the activation sequence circuitry 134 may be configured to cause an activation power to be provided to a first memory component in the chain of memory components based on the memory component activation sequence. For instance, a triggering signal may be transmitted to a first memory component in the chain (as indicated by the memory component activation sequence) to cause the first memory component to be activated. Once activated, the first memory component may transmit a signal indicative of its activated status to the activation sequence circuitry 134 and/or an amount of delay may be imparted to ensure that the first memory component is activated. Responsive to activation of the first memory component (e.g., receipt of a signal indicative of the activated status) and/or elapse of the delay, the activation sequence circuitry 134 may transmit a triggering signal to a second memory component in the chain to cause the second memory component to be activated, and so forth until all memory components are sequentially activated (e.g., with the introduction of an intentional amount of delay such as delay attributable to a resistor and capacitor (RC) delay circuit) between activation of at least some of the memory components).

In some embodiments, the activation sequence or an indicator of the activation sequence may be stored in memory 132 or other location in the main memory 102, among other possibilities. For instance, the activation sequence circuitry 134 may include fuse circuitry (not illustrated). Alternatively or in addition, the fuse circuitry may be included in a given package and/or a given die. For instance, each package may include respective fuse circuitry, among other possibilities.

The fuse circuitry may include an indicator of the activation sequence. The indicator may be a datum or other indicator that permits activation sequence circuitry 134 to determine the memory component activation sequence based on the datum. For example, the datum may be indicative of respective time periods associated with each of the memory components in the memory component activation sequence and the activation sequence circuitry 134 may be configured to determine, based on a value of the datum, the respective time periods associated with each of the memory components in the memory component activation sequence (e.g., with the introduction of an intentional amount of delay between activation of at least some of the different memory components).

In some embodiments, the activation sequence circuitry 134 may permit an end user, an administrator, or other individual to set or alter the memory component activation sequence. That is, unlike previous approaches which do not permit an end user or other individual to alter a memory component activation sequence, the approaches herein may permit alteration of an activation order of a memory components in the memory component activation sequence depending, for instance, on a preference of the end user, and yet still ensure that the memory components are sequentially activated.

FIG. 2A illustrates an example configuration 221 of memory die suitable for sequenced activation of the memory components in accordance with some embodiments of the disclosure. As illustrated in FIG. 2A, the example configuration 221 may include a first memory die 220-1, a second memory die 220-2, . . . , a third memory die 220-D (collectively referred to as memory die 220). While the example configuration 221 includes three memory die, any quantity of the memory die (e.g., 4 memory die, 8 memory die, 16 memory die, etc.) may be employed. The memory die 220 can be analogous or similar to memory die 120 in FIG. 1. In some embodiments, each of the memory die 220 may be included in an individual package (in the same individual package), among other possibilities.

The memory die 220 can be configured (e.g., wired) in a cascaded or daisy-chained manner. Power 226 may be provided to the memory die 220. The power 226 may be as power provided from a voltage regulator 229 (e.g., a power supply including the voltage regulator 229) that is coupled to each of the memory die 220. The voltage regulator may include or form a portion of the power circuit 140 described with respect to FIG. 1. In some embodiments, the voltage regulator is an individual voltage regulator that is coupled to each package of the packages, each memory die of the plurality of memory die 220, or both.

Activation voltages may be provided in a sequential manner to each of the memory die that are configured in the cascaded or daisy-chained manner. For instance, each of the memory die 220 may be provided power from the voltage regulator 229 concurrently but may be provided with respective activation powers (e.g., ramped activation powers (e.g., ramped current and/or voltages) than are higher than normal operational power) at different times in accordance with the memory component activation sequence. For example, the first memory die 220-1 may be activated at a different time than at least one of the other memory die 220. Stated differently, the first memory die 220-1 may be activated in the absence of activation of at least one other memory die of the memory die 220. Similarly, each of the other memory die may be activated in the absence of activation of at least one other memory die of the memory die 220.

For instance, a delay (e.g., RC delay attributable to a resistor and capacitor (RC) delay circuit) can be intentionally imparted between activation of different memory components. The duration of the delay (e.g., RC delay) between providing an activation power to different memory die may be the same or different. For instance, in some embodiments, the delay between providing the activation power to each of the memory die 220 may be the same. For example, the first memory die may be provided with an activation power for a first time period and subsequently a first amount of delay (e.g., RC delay) may be imparted prior to providing an activation power for a first time period to the second memory die 220-2. Similarly, a second amount of delay may be imparted prior to providing an activation power for a third time period to the third memory die 220-D. Thus, the activation power provided to (e.g., consumed by) each of the memory die 220 can be staggered.

For instance, an activation power may be provided via a first CA link 227-1 to the first memory die 220-1 for a first time period in accordance with a memory component activation sequence in the absence of providing (e.g., concurrently providing) an activation power to at least one other memory die (e.g., the second memory die 220-2, the third memory die 220-D, etc.). That is, a portion of the power 226 may be provided to memory cells or other components in the first memory die 220-1 to as an activation power (first activation power) to activate the first memory die 220-1 in the absence of providing an activation power to at least one other memory die (at the same time as the first activation power is provided to the first memory die 220-1).

Subsequently (e.g., once the first memory die 220-1 is activated) a portion of the power 226 may be provided via a second CA link 227-2 to the second memory die 220-2 as an activation power (second activation power) for a second time period in accordance with a memory component activation sequence. The activation power (second activation power) may be provided to memory cells or other components in the second memory die 220-2 in the absence of providing an activation power to at least one other memory die (e.g., in the absence of providing an activation power to the memory cells in the first memory die 220-1 and/or the third memory die 220-D, etc.).

Additionally, a portion of the power 226 may be subsequently (e.g., once the first memory die 220-1 and the second memory die 220-2 are activated) provided via the third CA link 227-C to the third memory die 220-D as an activation power (third activation power) to activate memory cells or other components in the third memory die 220-D in accordance with a memory component activation sequence. The third activation power may be provided to memory cells or other components in the third memory die 220-D in the absence of providing (e.g., concurrently providing) an activation power to at least one other memory die (e.g., in the absence of providing an activation power to the memory cells in the first memory die 220-1 and/or the second memory die 220-2, etc.).

Once the memory die 220 are activated, the power 226 may continue to be provided to each of the memory die 220 at a normal operational level. For instance, the power 226 may continue to be provided to the memory die to permit a host to invoke memory operations involving the memory die 220.

FIG. 2B illustrates another example configuration 222 of memory die suitable for sequenced activation of memory components in accordance with some embodiments of the disclosure. FIG. 2B is analogous to FIG. 2A with the proviso that signals (e.g., represented as external signals 251-1, 251-2, and 251-C) may be present to activate the memory die in accordance with the activation sequence (e.g., rather than having the respective die be activated based on an amount of delay as described with respect to FIG. 2A). Alternatively, or in addition, one or more of the signals 251-1, 251,-2, and/or 251-C may be internal signals such as those provided by a die and/or package to another component (e.g., to another die and/or package).

As illustrated in FIG. 2B, the portion of the power 226 may be provided from the voltage regulator 229 via the power rail 235 to each of the memory die 220 at different respective time periods in accordance with a memory component activation sequence to activate each memory die 220. In some embodiments, the memory die 220 may be electrically coupled to the power rail 235 via interface circuitry. Examples of the interface circuitry include traces, buses, and/or other types of interface circuitry configurable to electrically couple the memory die 220 to the power rail 235. For instance, the memory die 220 may be coupled to the power rail 235 via CA links 227 as described herein, among other possibilities.

In some embodiments, a controller (such as the controller 106 in FIG. 1) may be configured to cause activation power to be provided via the power rail 235 to different memory die at different respective time periods in accordance with the memory component activation sequence. For instance, the controller may cause various switches, buses, CA circuity and/or other interface circuitry to selectively provide the portion of the power 226 via the power rail 235 as activation powers to one or more respective memory die (but not all memory dies) at different respective time periods in accordance with a memory component activation sequence.

Continuing with the non-limiting example illustrated in FIG. 2B, a portion of the power 226 may be provided via the power rail 235 and via a first CA link 227-1 as an activation power to the first memory die 220-1. The activation power may be provided to the first memory die 220-1 responsive to receipt of a first activation signal 251-1 at the first memory die. The first activation signal 251-1 (and similarly the other activation signals described herein) may be an external signal transmitted by a controller such as those described herein or may be an internal signal (e.g., internal to a die and/or a package). The activation voltage may be provided to the first memory die for a first time period in accordance with the memory component activation sequence in the absence of providing an activation power to at least one of the other memory die (e.g., the second memory die 220-2 and/or the third memory die 220-D). The activation power (first activation power) may be a ramped activation power that is ramped (e.g., increased) during the first time period to activate the first memory die 220-1.

An activation power may be subsequently provided to another memory die that is next in the memory component activation sequence. The activation power may be provided to the second memory die 220-2 responsive to receipt of a second activation signal 251-2 at the second memory die. For instance, continuing with the non-limiting example illustrated in FIG. 2B, a portion of the power 226 may be provided via the power rail 235 and via a second CA link 227-2 to the second memory die 220-2 as a second activation power for a second time period in accordance with the memory component activation sequence in the absence of providing an activation power to at least one of the other memory die (e.g., the first memory die 220-1 and/or the third memory die 220-D). The second activation power may be a ramped activation power that is ramped.

Continuing with the non-limiting example illustrated in FIG. 2B, a portion of the power 226 may be provided via the power rail 235 and via the third CA link 227-C to the third memory die 220-D. The activation power may be provided to the third memory die 220-D responsive to receipt of a third activation signal 251-C at the third memory die. The third activation power may be provided to the third memory die 220-D for a third time period in accordance with the memory component activation sequence in the absence of providing an activation power to at least one of the other memory die (e.g., the first memory die 220-1 and/or the second memory die 220-2). The third activation power may be a ramped activation power that is ramped (e.g., increased) during the third time period to activate the third memory die 220-D. That is, each of the memory die 220 may be activated by the respective ramped activation power provided thereto in accordance with the memory component activation sequence.

FIG. 2C illustrates yet another example configuration 231 of memory die suitable for sequenced activation of memory components in accordance with some embodiments of the disclosure. FIG. 2C is analogous to FIG. 2B with the proviso that a control memory die is configured to arbitrate when activation power is provided to the respective memory die, rather than employing external activation signals associated with each memory die as described in FIG. 2B.

For instance, the control memory die (represented by "CONTROL" in FIG. 2C) may be the first memory die (Die1) 220-1, as illustrated in FIG. 2C. That is, an individual memory die of the plurality of memory die may be a control memory. However, any one or more of the memory die may be control memory die. The control memory die may include logic or other circuitry that is configured to arbitrate in accordance with a memory component activation sequence when each secondary memory die (represented by "SECONDARY") such as the second memory die 220-2 and/or the third memory die 220-D are provided a respective activation power. For instance, arbitration signals (represented as 233-1, 233-2) may be transmitted via circuitry (e.g., via the CA links, etc.) between the control memory die and each of the secondary memory die to permit the control memory die to arbitrate provisioning of an activation power (via the rail 335) to each of the memory die 220 in accordance with the memory component activation sequence. The first memory die (Control die) may initiate activation of the memory components responsive to receipt of an activation signal 251-1 (e.g., an activation signal transmitted by a controller such as those described herein), among other possibilities. While the signal 251 is illustrated as an external signal, in some embodiments the signal 251 may be an internal signal which is initiated from a die (e.g., the first package).

FIG. 3A illustrates an example configuration 333 of packages suitable for sequenced activation of memory components in accordance with some embodiments of the disclosure. FIG. 3A is analogous to FIG. 2B with the proviso that the packages are present in the place of the memory die. As illustrated in FIG. 3A, the configuration 333 may include a first package ("Pck1") 338-1, a second package ("Pck2") 338-2, . . . , a third package ("PckX") 338-P (collectively referred to as packages 338). While the configuration 333 includes three packages, any quantity of packages may be employed. The packages 338 can be analogous to or similar to package 138 illustrated in FIG. 1.

As illustrated in FIG. 3A, the power 326 may be provided from the voltage regulator 329 via the power rail 335 to each of the packages 338. Notably, a portion of the power 326 may be provided via the power rail 335 as a plurality of activation powers that are provided at different respective time periods in accordance with a memory component activation sequence to activate each of the packages 338. In some embodiments, the packages 338 may be electrically coupled to the power rail 335 via interface circuitry. Examples of the interface circuitry include traces, buses, and/or other types of interface circuitry configurable to electrically couple the packages 338 to the power rail 335. For instance, the packages 338 may be coupled to the power rail 335 via CA links 327-1, 327-2, . . . , 327-C as described herein, among other possibilities.

In some embodiments, a controller (e.g., the controller 106 illustrated in FIG. 1) may be configured to cause the portion of the power 326 to be provided via the power rail 335 as activation powers to different packages at different respective time periods in accordance with the memory component activation sequence. For instance, the controller may cause various switches, buses, CA circuity and/or other interface circuitry to selectively enable activation power to one or more respective packages (but not all packages) at different respective time periods in accordance with a memory component activation sequence, similar to the memory die described with respect to FIG. 2B. For example, the activation power may be provided to the first package 338-1 responsive to receipt of a first activation signal 351-1 at the first package. The activation power also may be provided to the second package 338-2 responsive to receipt of a second activation signal 351-2 at the second package 338-2. The activation power also may be provided to the third package 338-P responsive to receipt of a third activation signal 351-C at the third package 338-P.

FIG. 3B illustrates another example configuration 336 of packages suitable for sequenced activation of memory components in accordance with some embodiments of the disclosure. FIG. 3B is analogous to FIG. 2A with the proviso that the packages are present in the place of the memory die.

In some embodiments, the sequenced activation of the packages described in connection with any one of FIG. 3A-3B may be employed with the sequenced activation of the memory die described in connection with any one of FIGS. 2A-2C. For instance, in some embodiments each respective package may be activated in a sequential manner in accordance with a memory component activation sequence and each respective memory die included in the packages may also be activated in a sequential manner in accordance with the memory component activation sequence. For example, each respective memory die in a first package may be activated in a sequential manner prior to activation of each respective memory die in a second package being activated in a sequential manner. The sequential activation of each package of the packages and the sequential activation of each memory die of the respective memory die included in each package may yield a further reduction in a peak power consumption associated with activation of a memory device including a plurality of packages (each have a plurality of memory die).

Figure 4:
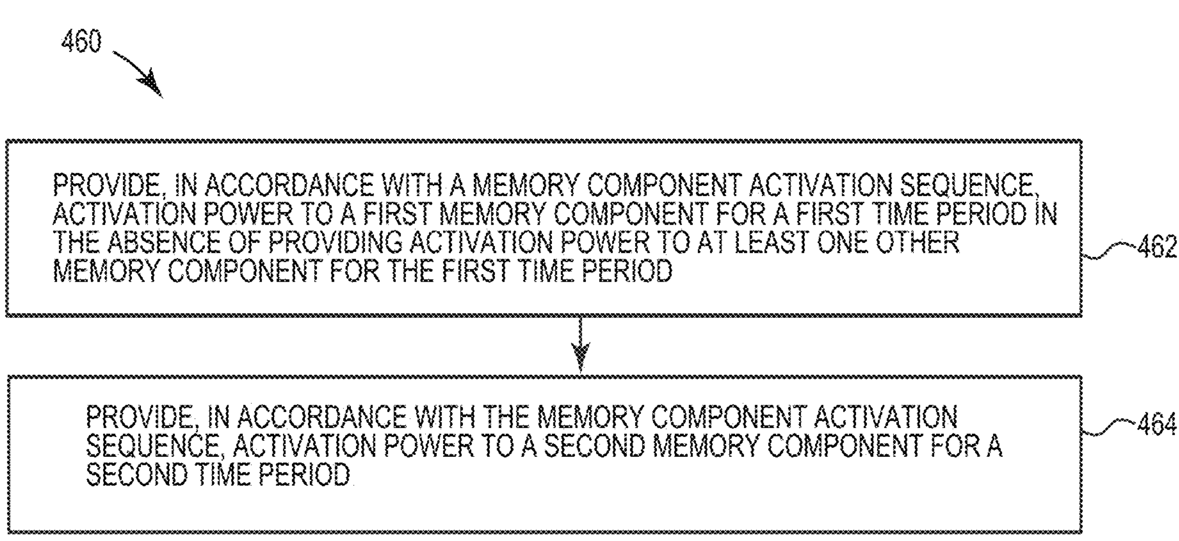
FIG. 4 is a flow diagram corresponding to a method for sequenced activation of memory components in accordance with some embodiments of the disclosure.

FIG. 4 is a flow diagram corresponding to a method 460 for sequenced activation of memory components in accordance with some embodiments of the disclosure The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the controller 106 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As mentioned, approaches herein provide, in accordance with a memory component activation sequence, an activation power to a given memory component (e.g., a memory die and/or a package) in a memory device in the absence of providing an activation power to at least one other memory component in the memory device. Stated differently, an activation power may be provided to one more memory components in a memory device in the absence of providing an activation power to one or more other memory components in the memory device.

For instance, an activation power may be provided to a given memory component (e.g., a given memory die, a given package including memory die, or both), in the absence of providing an activation power to a majority of the other memory components at the same time, among other possibilities as described herein. As such, approaches herein may realize a reduction in peak power consumption during activation of the memory components. The reduction in peak power may permit the use of smaller voltage regulators, enhance memory device performance, reduce heat generation, and/or provide other benefits, as described herein.

Additionally, in some embodiments an activation power may be provided, in accordance with a memory component activation sequence, to an individual memory component (e.g., a first memory die included in an individual package) in the absence of providing an activation power to any other memory component at that same time. In such embodiments, subsequent to activation of the memory component (e.g., the first memory die), a subsequent activation power may be provided, in accordance with the memory component activation sequence, to another individual memory component (e.g., a second memory die in the individual package) in the absence of providing the activation power to another other memory die. In this way, each of the individual memory components (e.g., individual memory die) may be activated in the absence of activation of any of the other memory components at the same time to realize a further reduction in peak power consumption during activation of the memory components.

At operation 462, the method 460 includes enabling, in accordance with a memory component activation sequence, a first activation power (e.g., a first memory die activation power) to a first memory component of a plurality of memory components for a first time period. As mentioned, the first activation power may be enabled (e.g., provided) to the first memory die in the absence of enabling an activation power to at least one other memory die of the plurality of memory die during the first time period. For instance, for a given package having sixteen memory die an activation power may be enabled for a memory die in the package in the absence of enabling an activation power to at least one, at least two, at least three, at least four, at least five, at least six, at least seven, at least eight, at least nine, at least ten, at least eleven, at least twelve, at least thirteen, at least fourteen, or fifteen of the other memory die at the same time (e.g., at the first time period). In some embodiments, an activation power may be enabled for a memory die (one or more memory die) in a memory device the absence of enabling an activation power to at least half of the other memory die in the memory device. For example, continuing with the above example, an activation power may be enabled for a memory die at a given time in the absence of enabling an activation power to at least eight other memory die included in the package of the memory device at the given time. Further, in some embodiments, an activation power may be enabled at a given time to an individual memory die in the absence of enabling an activation power to any other memory die in the memory device at the given time.

In some embodiments, the method 460 includes enabling, in accordance with a memory component activation sequence, a first activation power (e.g., a package activation power) to a first package included in a plurality of package for a first time period. As mentioned, the first activation power may be enabled to the first package in the absence of enabling an activation power to at least one other package of the plurality of package during the same time period (e.g., the first time period). Stated differently, a peak power consumption associated with activation of the packages (memory packages) may be reduced by way of activation of the first package in the absence of activation of at least one other package, as compared to other approaches that activate each of the packages at substantially the same time. In some embodiments, an activation power may be enabled for a package (one or more packages) in a memory device the absence of enabling an activation power to at least half of the other packages in the memory device. For example, continuing with the above example, an activation power may be enabled at a given time to a package in the absence of providing an activation power to at least two other packages in the memory device at the given time. Further, in some embodiments, an activation power may be provided at a given time to an individual memory die in the absence of providing an activation power to any other packages in the memory device at the given time.

Additionally, in some embodiments, the method 460 includes enabling, in accordance with a memory component activation sequence, an activation power to a memory die included in a package for a time period in the absence of enabling an activation power to at least one other memory die included in the package and also in the absence of enabling an activation power to at least one other package of the plurality of packages during the time period. Enabling the activation power to the memory die in the absence of enabling an activation power to at least one other memory die included in the package and also in the absence of enabling an activation power to at least one other package during the same time period may yield a further reduction in peak power consumption during activation of the packages including the memory devices. For instance, the activation power may be enabled for the memory die in the absence of enabling an activation power to any other memory die included in the package and also in the absence of enabling an activation power to any other package to yield a maximum reduction in power consumption associated with activation of memory components.

For example, in a memory device with including eight packages (X=8) with sixteen die per package (Y=16) and an respective activation time of 25 microseconds for each activation power applied to the memory die the total duration of time to activate each of the packages and memory device (assuming no overlap in activation signals) may be equal to 3.2 milliseconds, among other possible values depending on a quantity of packages, memory die, activation duration, etc. The above total duration of time (3.2 milliseconds) of the memory component activation sequence may be a fraction longer than a time (e.g., ~25 microseconds) associated with other approaches that enable (provide) an activation power to all memory components in a memory device at substantially the same time. Notably, the time difference between the different approaches may be imperceptible to an end user and yet, as described herein, may yield a maximum reduction in peak power consumption associated with memory component activation.

However, some embodiments herein may activate two or more memory die (but not all memory dies) at the same time and/or two or more packages (but not all packages) at the same time. Such embodiments may achieve a reduction (e.g., relative to activating each package and memory die individually) in a total duration of time to activate each of the memory components, and yet still yield a reduction in peak power consumption during activation, as compared to other approaches that activate all memory components in a memory die at substantially the same time.

For instance, at 464 the method 460 includes enabling, in accordance with the memory component activation sequence, a second activation power to a second memory component for a second time period. The second activation power may be enabled for the second memory component for the second time period in the absence of enabling an activation power to at least one other memory component. For instance, the second activation power may be enabled for the second memory component in the absence of enabling an activation power to at least one other memory component (in addition to the first memory component which has already been activated). In some examples, the second activation power may be enabled to the second memory component in the absence of enabling an activation power for at least half of the other memory components. In some embodiments, the second activation power may be enabled for the second memory component in the absence of enabling an activation power to any other memory components.

While described above predominately with respect to the first memory component and the second memory component it is understood that the sequential activation of the memory components can be employed for each of the memory components in a memory device. For instance, each of the memory components (e.g., a memory die or package) in a memory device may be sequentially activated in the absence of at least one other memory component, as described herein.

The second time period may or may not overlap with the first time period. In some embodiments, the second time period may be offset from (have a different starting and/or ending time) than the first time period. For instance, a start of the second time period may be after (subsequent to) a start of the first time period and an end time of the second time period may be after an end time of the first time period.

The first time period and the second time period may have the same or different respective durations. For instance, the first time period and the second time period may be substantially the same (have the same duration) when each of the time periods is associated with the same type of memory component (e.g., a memory die or a package). Similarly, the first activation power and the second activation power may have the same or different magnitudes. For instance, each of the activation powers applied to each of the memory die may have the same magnitude and duration but at least a portion of the activation powers may be enabled for different memory die at different time periods. For example, the first activation power may be a ramped activation power having a given magnitude at a given point in time during the first time period that is equal to a magnitude at a corresponding (same) point in time during the second time period. Similarly, each of the activation powers applied to each of the packages may have the same magnitude and duration but at least a portion of the activation powers may be enabled for different packages at different time periods.

In some embodiments, a portion of the second time period may overlap with a portion of the first time period. As such, an activation power (e.g., a first activation power) may be enabled for the first memory component while an activation power (e.g., the second activation power) is enabled for the second memory component during the portion of time at which the first time period overlaps with the second time period. In some embodiments, the second time period may overlap with some but not all of the first time period. For instance, the second time period may overlap with a given percentage or portion of the first time period but not all of the first time period. For example, the second time period may overlap with less than half of the first time period (less than half of a total duration of the first time period), less than a third of the first time period, less than a fifth of the first time period, less than a tenth of the first time period, etc. Having a portion of the second time period overlap with a portion of the first time period may reduce a total amount of time to activate each of the memory components and yet still yield a reduction in peak power consumption by memory components during activation of the memory components.

However, in some embodiments, the second time period may not overlap with the first time period. A maximum reduction in peak power consumption associated with activation of each of the memory components (e.g., activation of each of the respective memory components at different non-overlapping time periods) may be realized when the second time period does not overlap with a portion of the first time period. For instance, a start time of the second time period may be after an end time of the first time period. In some embodiments, the second time period may start substantially immediately after the first time period ends. Having the second time period start substantially immediately after the first time period ends may ensure that the time periods do not overlap and yet promote timely activation of each of the memory components.

In some embodiments, the memory components such as the first memory component and the second memory components are non-volatile memory components included in a non-volatile memory device such as those described herein. For instance, the non-volatile memory device may be a solid-state drive (SSD), among other possibilities. However, in some embodiments, the memory components such as the first memory component and the second memory components are volatile memory components included in a volatile memory device. For instance, the volatile memory device may be a dynamic random access memory (DRAM), among other possibilities.

As mentioned, in some embodiments the memory components may be memory die, packages (including memory die), or both. For instance, in some embodiments, the memory components may include a plurality of memory die in one or more packages. For example, the above mentioned first memory components and the second memory component may be a first memory die and a second memory die which are included in one or more packages. However, in some embodiments the first memory component and the second memory component may be a first package and a second package, respectively, as described herein. Again, while reference is made to a first memory component and a second memory component it is understood that the sequenced activation of memory components described herein is applicable to any quantity of memory components.

In some embodiments, a total duration of the memory activation sequence is equal to a sum of a duration of respective activation times of each memory component. For instance, the total duration of the memory activation sequence may be equal to a sum of respective activation time of each memory die included in one or more packages in a memory device. That is, the total duration of the memory activation sequence may be equal to an amount of time to activate each memory component (e.g., each memory die included in each package) in a memory device.

Figure 5:
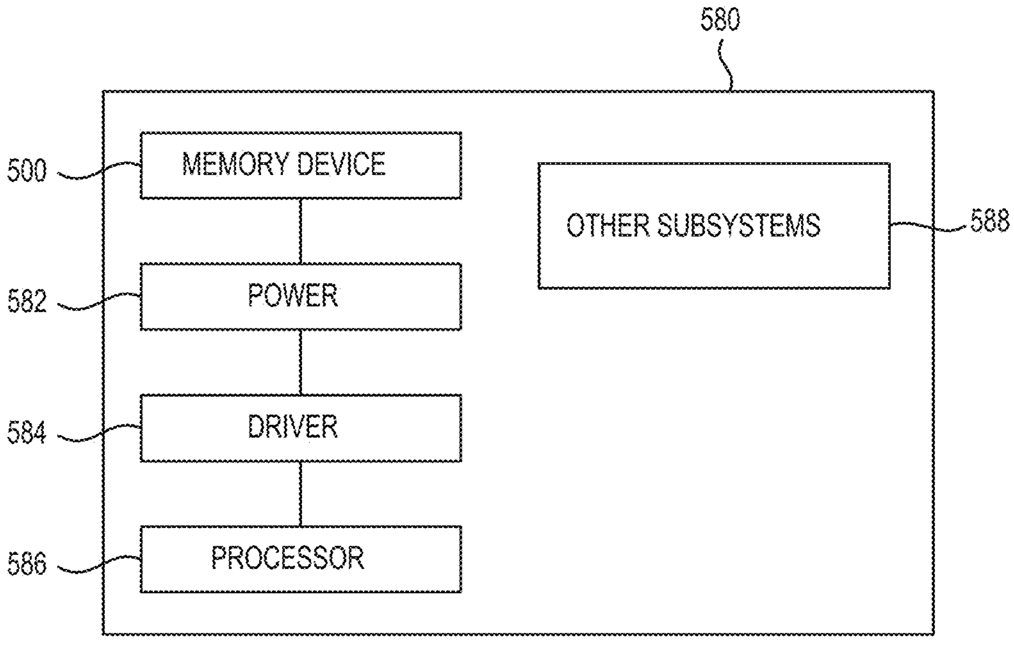
FIG. 5 is a block diagram of an example computer system that includes a memory device in accordance with some embodiments of the disclosure.

FIG. 5 is a block diagram of an example computer system 580 that includes a memory device 500 in accordance with some embodiments of the disclosure. Any one of the foregoing memory devices and configuration of memory die and/or packages described above with reference to FIGS. 1-4 can be incorporated into any of a myriad of larger and/or more complex systems, a representative example of which is system 580 shown schematically in FIG. 5. The system 580 can include a memory device 500, a power source 582, a driver 584, a processor 586, and/or other subsystems or components 588.

The memory device 500 can include features generally similar to those of the memory device and configuration of memory die and/or configuration of packages described above with reference to FIGS. 1-4, and can therefore include various features for sequenced activation of memory components The resulting system 580 can perform any of a wide variety of functions, such as memory storage, data processing, and/or other suitable functions. Accordingly, representative systems 580 can include, without limitation, hand-held devices (e.g., mobile phones, tablets, digital readers, and digital audio players), computers, vehicles, appliances and other products. Components of the system 580 may be housed in a single unit or distributed over multiple, interconnected units (e.g., through a communications network). The components of the system 580 can also include remote devices and any of a wide variety of computer readable media.

It should be noted that the methods described above describe possible implementations, and that the operations and the steps may be rearranged or otherwise modified and that other implementations are possible. Furthermore, embodiments from two or more of the methods may be combined. Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method comprising:

providing, in accordance with a memory component activation sequence, a first activation power to a first memory component of a plurality of memory components within a memory device for a first time period, wherein the first activation power is provided in the absence of providing an activation power to at least one other memory component of the plurality of memory components within the memory device during the first time period; and providing, in accordance with the memory component activation sequence, a second activation power to a second memory component for a second time period.

2. The method of claim 1, further comprising providing the first activation power to the first memory component in the absence of providing an activation power to at least half of the other memory components during the first time period.

3. The method of claim 1, further comprising providing the first activation power to the first memory component in the absence of providing an activation power to any of the other memory components during the first time period.

4. The method of claim 1, wherein the first activation power is a first ramped activation power, and wherein the second activation power is a second ramped activation power.

5. The method of claim 1, wherein a portion of the second time period overlaps with a portion of the first time period.

6. The method of claim 1, wherein the second time period does not overlap with the first time period, wherein the second time period starts substantially immediately after the first time period ends.

7. An apparatus comprising:

a first memory component of a plurality of memory components within a memory device;

a second memory component of the plurality of memory components within the memory device;

a voltage regulator coupled to the first memory component and the second memory component; and activation sequence circuitry configured to activate the first memory component and the second memory component in accordance with a memory component activation sequence by:

providing, via the voltage regulator, a first activation power to the first memory component for a first time period to activate the first memory component in the absence of providing an activation power to at least one other memory component of the plurality of memory components during the first time period; and providing, via the voltage regulator, a second activation power to the second memory component for a second time period to activate the second memory component.

8. The apparatus of claim 7, wherein the first memory component and the second memory component are stacked memory components.

9. The apparatus of claim 8, wherein the first memory component and the second memory components are stacked non-volatile memory components included in a non-volatile memory device.

10. The apparatus of claim 8, wherein the first memory component and the second memory components are stacked volatile memory components included in a volatile memory device.

11. The apparatus of claim 10, wherein the volatile memory device is a dynamic random access memory (DRAM).

12. The apparatus of claim 7, wherein a magnitude of the first activation power is equal to a magnitude of the second activation power.

13. The apparatus of claim 7, wherein the first memory component and the second memory components further comprises a first and a second package, respectively.

14. The apparatus of claim 7, wherein a total duration of the memory activation component sequence is equal at least to a sum of a duration of respective activation times of each memory component in a given package times a quantity of the plurality of packages.

15. A system comprising:

a plurality of packages within a memory device including a plurality of stacked memory components, the plurality of stacked memory components including a first memory component, a second memory component, and a third memory component;

a voltage regulator coupled to at least one memory component of the plurality of stacked memory components; and activation sequence circuitry configured to:

provide, in accordance with a memory component activation sequence, a respective activation power to each package of the plurality of packages in the absence of providing an activation power to at least one other package of the plurality of packages; and provide, in accordance with the memory component activation sequence, a respective activation power to each memory component of the plurality of stacked memory components in a respective package in the absence of providing an activation power to at least one other memory component of the respective package.

16. The system of claim 15, wherein the voltage regulator is an individual voltage regulator that is coupled to each package of the plurality of packages, each memory component of the plurality of stacked memory components, or both.

17. The system of claim 15, wherein the activation sequence circuitry is configured to determine the memory component activation sequence responsive to an occurrence of a power-up event associated with the system.

18. The system of claim 17, wherein:

the activation sequence circuitry includes fuse circuitry;

an indicator of the memory component activation sequence is stored in the fuse circuitry; and the activation sequence circuitry is configured to determine the memory component activation sequence based on the indicator.

19. The system of claim 15, wherein:

at least one package of the plurality of packages has a respective power output that is coupled to a respective power input of another package in the plurality of packages;

at least one memory component of the plurality of stacked memory components has a power output that is coupled to a power input of another memory component in the plurality of stacked memory components; or both.

20. The system of claim 15, wherein the activation sequence circuitry is configured to:

provide, in accordance with the memory component activation sequence, a respective activation power to each individual package of the plurality of packages in the absence of providing an activation power to any other package of the plurality of packages;

provide, in accordance with the memory component activation sequence, a respective activation power to each individual memory component of the plurality of stacked memory components in a respective package in the absence of providing an activation power to any other memory component of the plurality of packages in the respective package; or both.

* * * * *